United States Patent [19]
Sukjarev

[11] Patent Number: 6,028,014
[45] Date of Patent: Feb. 22, 2000

[54] PLASMA-ENHANCED OXIDE PROCESS OPTIMIZATION AND MATERIAL AND APPARATUS THEREFOR

[75] Inventor: Valeriy Y. Sukjarev, Cupertino, Calif.

[73] Assignee: LSI Logic Corporation, Milpitas, Calif.

[21] Appl. No.: 08/966,637

[22] Filed: Nov. 10, 1997

[51] Int. Cl.$^7$ .................................................. H01L 23/29
[52] U.S. Cl. .............................................. 438/789; 438/5
[58] Field of Search ................................... 438/5–18, 789

[56] References Cited

PUBLICATIONS

Crowell, et al, Model Studies of Dierectri Thin Film Growth: Chemical Vapor Deposition of $SiO_2$, J. Vac. Sci. Technology. A 8 (3), May/Jun. 1990, pp. 1864–1870.

Raupp, et al., The Role of Oxygen Excitation and Loss in Plasma–Enhanced Deposition of Silicon Dioxide from Tetraethylorthosilicate, J. Vac. Sci. Technology B 10 (1), Jan./Feb. 1992, pp. 37–45.

Stout, et al., Monte Carol Simulation of Surface Kinetics During Plasma Enhanced Chemical Vapor Deposition of $SiO_2$ Using Oxygen/Tetraethoxysilane Chemistry, J. Vac. Sci. Technology A, vol. 11, No. 5, Sep./Oct. 1993, pp. 2562–2571.

Dobkin, et al., Mechanics of Deposition of $SiO_2$ from TEOS and Related Organosilicon Compounds and Ozone, J. Electrochemical Soc. vol. 142, No. 7, Jul. 1995, pp. 2332–2340.

Grapperhaus, et al., A Semianalytic Radio Frequency Sheath Model integrated into a Two–Dimensional Hybrid Model for Plasma Processing Reactors, J. Appl. Phys. 81 (2), Jan. 15, 1997, pp. 569–577.

*Primary Examiner*—Olik Chaudhuri
*Assistant Examiner*—Anh Duy Mai

[57] ABSTRACT

Apparatus and method for forming silicon dioxide films on semiconductors using oxygen plasma and TEOS includes mass spectrometric and/or optical emission spectrometric analyses of the plasma to control selected operating parameters in order to increase the ratio of molecular oxygen cations to atomic oxygen cations present in the plasma, thereby to reduce the resultant concentrations of carbon and hydrogen atoms contained in the oxide film thus formed. Oxide films of high dielectric properties are identified as having concentrations of carbon not greater than about 1 ppm, and hydrogen not greater than about 10E13 cm-3. Bond energies among atoms of carbon, oxygen, hydrogen, and silicon in TEOS are analyzed to indicate requisite operational parameters in a plasma including oxygen and TEOS for forming oxide films of superior dielectric properties.

6 Claims, 2 Drawing Sheets

PLASMA-ENHANCED OXIDE PROCESS OPTIMIZATION AND MATERIAL AND APPARATUS THEREFOR

FIELD OF THE INVENTION

This invention relates to semiconductor processing and more particularly to optimized formation of silicon dioxide layers on semiconductors using plasma-enhanced chemical vapor depositions.

BACKGROUND OF THE INVENTION

Multi-level semiconductor structures commonly require intermetal dielectric films or layers of high quality and dielectric strength. Dielectric deposition processes for ultra-large scale semiconductor integrated circuits (ULSI) have developed primarily through extensive empirical experimentation. Process simulation tools and computer modelling schemes have evolved to assist in controlling numerous process parameters in attempting to make more predictable the properties of deposited dielectric films as functions of the process parameters involved in the fabrication of such films. It is therefore desirable to understand the deposition processes in order to predict operational ranges and interactions of fabrication parameters that will yield dielectric films with required characteristics.

Conventional tetraethoxysilane (TEOS)—based chemical vapor deposition enhanced by an oxygen plasma discharge is characterized by the complicated dependencies of the silicon dioxide ($SiO_2$) film deposition rate and film quality upon such factors as the design of the reactor chamber, inlet flow rates of process gases, inlet gas pressure, temperature distribution, plasma excitation power, and the like.

Increasing density of gates in ULSI technology dictates low-temperature processing at many stages of semiconductor fabrication. However, when this requirement applies to the deposition of the $SiO_2$ from TEOS, a conflict with the process requirements to achieve high film quality can arise. The quality of $SiO_2$ films can be compromised by the poor stability and impurities incorporated into the film when deposited at low temperatures. The film instability may be caused by high concentration of impurities incorporated into a growing film, and such impurities can degrade reliability of devices fabricated by such low-temperature processes. The sources of these impurities are typically the chemical reactions governing the film formation. As currently understood, $SiO_2$ film growth is a result of a number of homogeneous and heterogeneous reactions and processes including creation of active precursors from TEOS in a gas phase, and adsorption of these precursors on surface sites. For example, a conversion of remaining ethoxy groups into hydroxyl groups due to elimination of the carbon and hydrogen is considered as a possible limiting step of the entire process. See, for example, D. Dobkin et al, *J. Electrochem. Soc.* v. 142 pg. 2332 (1995). Many reactions are characterized by the high activation energies that require high temperatures to reach reasonably high $SiO_2$ deposition rates.

Certain known techniques of low temperature $SiO_2$ deposition include tetraethoxysilane-based plasma enhanced chemical vapor deposition (PETEOS or TEOS PECVD), and atmospheric pressure CVD (APCVD) Ozone/TEOS deposition. These known techniques rely upon introduction of reactive oxygen species which can react with TEOS and its fragments in the gas phase and in adsorbed layers to produce intermediate species that readily participate in the reaction with resultant formations of siloxane bonds in the $SiO_2$ layer that deposits at lower temperatures.

Different models for TEOS PECVD have been published with a suggestion that production of atomic oxygen is a rate limiting process to the $SiO_2$ deposition. See: G. B. Raupp et al, *J. Vac. Sci. Tech,* B10, pg. 37 (1992). Alternatively, the precursor adsorption is considered as a rate limiting factor. See: n.n. Islamraja et al, *J. Appl. Phys.,* vol 70, pg. 7137 (1991) and J. E. Crowell et al, *J. Vac. Sci. Tech,* A8, pg. 1864 (1990). The high conformality of $SiO_2$ films deposited by TEOS PECVD is also explained by the different deposition mechanisms *J Appl. Phys.,* vol 70, pg. 7137 (1991), cited, and P. J. Stuart et al *J. Vac. Sci. Tech.,* A11, pg. 2562 (1993). However, TEOS decomposition in the gas phase and on the surface of the growing film is considered as the only way to form the active intermediates responsible for siloxane bond formation.

SUMMARY OF THE INVENTION

In accordance with the present invention, a quantum chemical analysis of carbon and hydrogen elimination from TEOS and its gaseous fragments by interaction with oxygen atoms and with oxygen atomic and molecular cations present in an oxygen plasma, yields indications of the pathways of reactions of TEOS with oxygen atoms and cations for eliminating carbon and hydrogen from TEOS fragments and optimizing the high quality of oxide films thus deposited. The plasma-enhanced CVD (PECVD) films using a TEOS precursor prepared according to the present invention promote the use of TEOS oxides as an intermetal dielectric with the effect of producing better yields and comparable dielectric isolation. This makes possible the replacement of currently-used oxides at field, trench isolation, and sidewall spacers with PECVD oxide films prepared according to the present invention.

DETAILED DESCRIPTION OF THE INVENTION

Figure 1:
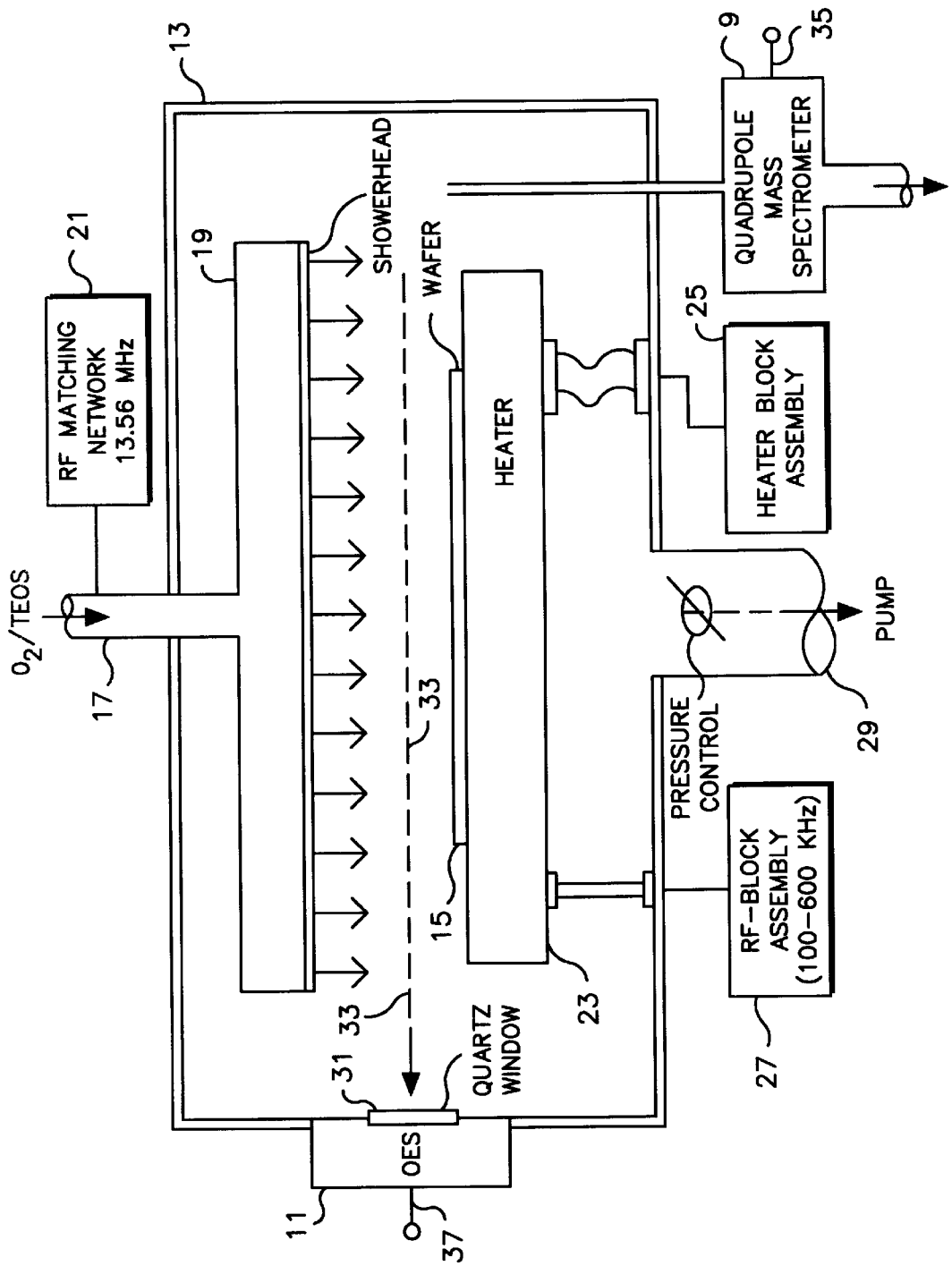
FIG. 1 is a pictorial block diagram of one embodiment of the present invention.

Conventional PECVD process has the capability of depositing high quality silicon dioxide film with properties approaching those of thermally-grown oxide. Due to ion bombardment attributable to the plasma, the PECVD process produces dense oxide films with low moisture content. For example, films conventionally deposited with $O_2$:TEOS flow ratio of about 50 contain approximately 5 wt% Si-OH and 2 wt% $H_2O$ after exposure to room air. Carbon, which is a part of the TEOS molecule, can be found at relatively high concentrations (100 to 1000 ppm) in oxide films conventionally grown. Typical values of the process parameters for conventionally grown PECVD oxide deposition include:

Pressure=0.5–3 torr;

Heater temperature=100–500° C.;

High frequency=13.56 MHz;

Low frequency=100–600 KHz;

HF and LF Power=0.1–1 KW;

$O_2$ flow rate=3–10 slm;

$O_2$:TEOS flow ratio=10–$10^3$.

Increasing ion energy flux, for example, by increasing the HF and LF (bias) power levels, results in more dense films with reduced concentration of Si—OH and C=O groups in the film. However, such a simple increase of the ion flux that includes a combination of atomic and molecular oxygen cations thus results in undesirable step coverage that is characterized by void formations in features with moderate and high aspect ratios. Also, increasing of the energy of oxygen ions impinging upon the wafer surface by increasing the bias power leads to increases in plasma-induced damages in a growing film. These conditions may be responsible for the increased charge level in films annealed at high temperatures (e.g., $1 \times 10^{11} \text{cm}^{-2}$ after anneal at 600° C., and $3 \times 10^{11} \text{cm}^{-2}$ after an anneal at 1100° C).

Calculations of the dissociation of various bonds in TEOS made it possible to arrange them in accordance with their bond strengths in a sequence of Si—O>C—O>C—C. However, TEOS decarbonization proceeds through the C—O bond cleavage because of the highly stable radicals that are formed after C—C bond cleavage. The calculation of the C—O bond cleavage pathway in the reaction between TEOS and oxygen atom equals about 36 kcal/mol when the alpha-H atom is abstracted. This is much lower than the C—O bond energy in TEOS (93–98 kcal/mol). The calculation of the C—O bond dissociation for cations and radicals that might be formed from TEOS as a result of the dioxygen cation insertion into the C—H bond yields a bond dissociation value of about 22 kcal/mol, and this is the lowest pathway energy among the reaction pathways examined. Similar calculations of the C—O bond dissociation as a result of the H-abstraction by an oxygen cation yield pathway bond energies to about 36 kcal/mol. These energies are much greater than in the case of dioxygen cation insertion into the C—H bond. Based upon the results of such quantum chemical calculations of energy of cleavages of various bonds in TEOS fragments, it is believed that both the oxygen atom and the oxygen cations significantly facilitate carbon and hydrogen elimination from TEOS, and that atomic oxygen cations facilitate TEOS decomposition in much slower rate than dioxygen molecular cations.

Based on these results, it is believed that higher-quality deposited $SiO_2$ films having only minimal carbon and hydrogen contamination can be achieved according to the present invention in a plasma reactor characterized by an excess concentration of $O_2^+$-ions in comparison with the concentration of the other oxygen radical species. Process parameters can be optimized with the aid of monitoring of the concentration of oxygen radicals within an oxygen plasma as a function of selected process parameters and reactor geometry. Optimization of PECVD process parameters and the reactor geometry according to the present invention results in an enrichment of the oxygen cation flux impinging upon the wafer surface by molecular cation $O_2^+$, which results in highest efficiency of hydrogen/carbon elimination from the growing film (e.g., $10^3$–$0^5$ times higher than can otherwise be achieved with O-atoms and $O^+$-cations). Thus, low hydrogen/carbon content in growing oxide films can be achieved using reduced ion energy flux, and this results in improved step coverage and decreased plasma-induced damage to wafers. Ideally, the resultant oxide film should have less than 1 part per million (ppm) carbon concentration and less than $10^{16} \text{cm}^{-3}$ hydrogen concentration in high quality films prepared according to the present invention.

In one embodiment of the present invention, for example, as illustrated in FIG. 1, stable species (of oxygen, and other elements) can be analysed by on-line mass spectrometry (MS) techniques 9, while the reactive species can be detected by optical emission spectrometry (OES) 11 within a chamber 13 in which an oxide film is deposited on a wafer 15 using TEOS PECVD processing according to the present invention. Specifically, oxygen plasma is used to assist $SiO_2$ deposition, and OES 11 is used in addition to MS 9 for the detection and control of the quantities of the charged species such as $O_2^+$ and $O^+$.

Gaseous TEOS and molecular oxygen are supplied from controlled sources of these gases under pressure (not shown) through inlet conduit 17 and gas distribution manifold, or 'shower head' 19. This manifold 19 contains numerous apertures and is disposed above the wafer 15 for substantially uniformly distributing the supplied gases over the surface of the wafer 15. The manifold or 'shower head' 19 may be formed of electrically-conductive material to serve also as an electrode to which a source of high-frequency energy (at about 13.56 MHz) is applied from a conventional RF generator and impedance-matching network 21. A wafer 15 is supported on a susceptor 23 that is spaced from the shower head/electrode 19 to support a plasma between the wafer 15 and shower head/electrode 19 under operating conditions as later described herein. The susceptor 23 may be selectively heated under control of a conventional heater assembly 25 to maintain the wafer 15 at a selected temperature during film deposition. A lower-frequency source 27 of biasing energy (at about 100–600 KHz) may also be connected to the susceptor/electrode 23 to selectively control the energy of oxygen ions impinging upon the surface of wafer 15 supported on the susceptor/electrode 23. Reduced pressure is maintained within the chamber 13 by a vacuum pump (not shown) connected to outlet conduit 29.

The operational parameters inside the reactor chamber 13 may be monitored and maintained in accordance with the present invention during formation of an oxide film on wafer 15, within the following examples of ranges of parameters:

EXAMPLE 1

Pressure within chamber 13: approximately 0.5 Torr;
Wafer 15 temperature: about 300° C.;
RF power level 21: approximately 0.4 Kwatts for 200 cm wafer 15;
Bias power level 27: approximately 0.4 Kwatts
Gas flow rates:
 TEOS: about 1 sccm
 Oxygen: about 7 slm

EXAMPLE 2

Pressure within chamber 13: approximately 1.5 Torr;
Wafer 15 temperature: about 350° C.;
RF power level 21: approximately 0.4 Kwatts for 200 cm wafer 15;
Bias power level 27: approximately 0.3 Kwatts;
Gas flow rates:
 TEOS: about 1 sccm;
 Oxygen: about 6 slm A gas plasma that is ignited and sustained between the shower head/electrode 19 and a wafer 15 supported on the susceptor/electrode 23, for example, within operational parameters as described above, contains numerous active or charged species of elemental and molecular oxygen ions and radicals, and fragments of decomposed TEOS. These components within the plasma are monitored during operation by the mass spectrometer 9 and by the optical emission spectrometer 11 that detects spectral emissions 33 from the plasma through an optical window 31 (typically formed of quartz) in a wall of the chamber. In one embodiment, a mass spectrometer 9 of a type such as Ametek Dycor, and an optical emission spectrometer of a type such as Silicon Fiber Detector may be used to provide respective outputs 35, 37 indicative of neutral oxygen radicals and oxygen ions that are present in the plasma. In this way, the total pressure, RF and Bias powers, gas temperature, and flow ratios of oxygen and TEOS may be selectively controlled according to the present invention during formation of an oxide film on wafer 15 to achieve high-quality films with reduced carbon and hydrogen constituent impurities in the film thus formed. Specifically, concentrations of atomic oxygen as well as the concentrations of TEOS decomposition fragments, which are the active precursors for $SiO_2$ formation, and which are by-products and end-products formed by the TEOS decomposition in the presence of oxygen, can all be detected by MS, Electron Spin Resonance (ESR) or FT-IR (Fourier-transform infrared absorption analysis). Additionally, diode laser and laser-induced fluorescence techniques as well as Langmuir and microwave interferometer probes can also be employed for such measurements. Thus, the outputs 35, 37 can be used to control the above-mentioned process parameters in conventional manner to achieve substantially optimized film-forming conditions within chamber 13, as previously described herein. For example, if the monitoring described above indicates that the concentration of oxygen atomic cations ($O^+$) is much greater than the concentration of molecular cations ($O_2^+$), then the total gas pressure may be increased (for example from 0.5 to 1.5 torr), or the residence time may be increased by reducing the oxygen flow rate (for example from 7 slm to 6 slm). These changes increase the atomic oxygen recombination rate that causes an increase in $[O_2^+]/[O^+]$ ratio which results in reduced carbon/hydrogen content in the growing film. Under these conditions, the bias power may be decreased, and this results in a further decrease in defect formation due to the reduction of the kinetic energy of oxygen cations impinging upon the surface of the wafer 15 upon which an oxide film is formed. Control experiments, for example using FT-IR, may be performed to monitor the carbon/hydrogen content in the growing film.

In another embodiment of the invention, hybrid plasma simulations may be performed, as described for example in the *J. Appl. Phys.*, v. 81, pg. 569, 1997, cited above. The deposition of the film about a surface feature such as a topology step can be described by the simultaneous heterogeneous reactions on the sidewall and reagent diffusion along the feature. The deposition rate of silicon dioxide from TEOS depends upon the surface chemistry as well as upon the reagent concentration, pressure and temperature distributions in the reactor and at the wafer surface. These distributions are mainly determined by the hydrodynamics and transport phenomena within the reactor as well as by the chemical reactions within the gas mixture in the reactor. The characterizations of such a reactor model may be used to establish operational parameters within a reactor chamber 13 for enhanced predictability of step coverage due to the effects of changes in operating conditions upon conformality of $SiO_2$ film about the surface feature. These results can be used to optimize process parameters and reactor chamber design in order to achieve high deposition rates with minimal defects. For example, the simulations of the densities of oxygen atoms and cations (formed in a discharge chamber similar to the chamber 13 of FIG. 1), performed for the different sets of plasma parameters yield the following results. For the same gas temperature (300 K), oxygen flow rate (about 3 slm), high frequency (13.56 MHz) with peak to peak voltage amplitude (100v), and zero low frequency power, then for two cases with the only difference related to total pressure, the following results are indicated:

For pressure P=0.5 torr: $[O_2^+]=10^{10} cm^{-3}$; $[O^+]=9\times 10^{15} cm^{-3}$; $[O]=7.5\times 10^{15} cm^{-3}$ For pressure P=1.0 torr: $[O_2^+]=2.5\times 10^{13} cm^{-3}$; $[O+]=9\times 10^{13} cm^{-3}$; $[O]=3.4\times 10^{15} cm^{-3}$ The electrode gap in both cases equals 2 cm. These results indicate that for these particular sets of process parameters, increasing the total pressure in the chamber by 2 increases the $[O_2^+]/[O^+]$ ratio from $10^{-6}$ to 0.28 for significantly improving the quality of $SiO_2$ film formed according to the present invention.

Figure 2:
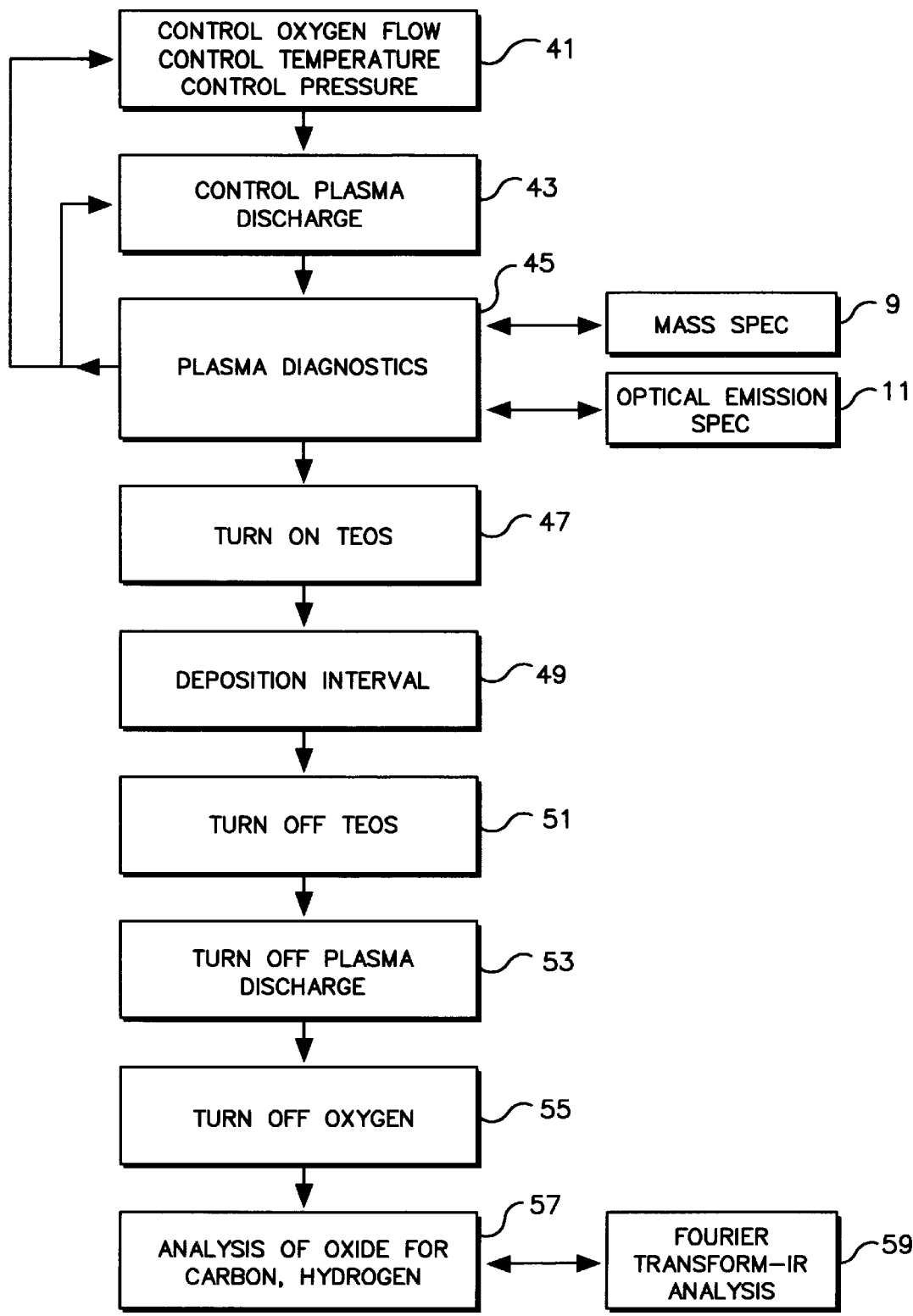
FIG. 2 is a flow chart illustrating the process according to one embodiment of the present invention.

Referring now to FIG. 2, there is shown a flow chart of a process for forming and controlling a growing oxide film in accordance with one embodiment of the present invention. The reactor chamber 13 is operationally conditioned by controlling 41 the flow rate of oxygen, setting the temperature of the wafer 15, and reducing the pressure within the chamber 13 to within the ranges of such parameter, as discussed above. RF power is supplied 43 to establish a plasma discharge between shower head/electrode 19 and wafer 15 on susceptor 23, and plasma may be diagnosed 45 using mass spectrometry 9 and/or optical emission spectrometry 11 for controlling the operating parameter, as described above, in order to maximize the ratio of molecular oxygen cations to atomic oxygen cations ($O_2^+/O^+\Rightarrow$maximum). TEOS gas is then introduced 47 into the plasma for a selected deposition interval 49 to form a silicon oxide film on wafer 15. The TEOS gas is then discontinued 51, the plasma is extinguished 53, for example by terminating the PF power, and the oxygen is then also discontinued 55.

The resulting oxide film may be analyzed 57 for carbon and hydrogen impurities using FT-IR 59, and operational parameters within reactor chamber 13 may again be established and altered, as discussed above, to reduce carbon and hydrogen impurities in oxide films subsequently prepared in accordance with the present invention.

What is claimed is:

1. A method for forming silicon oxide on a semiconductor comprising:

forming an oxygen plasma in contact with a semiconductor;

detecting ratio of molecular oxygen cations and atomic oxygen cations in the plasma;

controlling selected parameter of the plasma to alter the ratio of molecular oxygen cations to atomic oxygen cations detected in the plasma; and introducing TEOS into the plasma for a selected interval to form silicon oxide on the semiconductor.

2. The method according to claim 1 wherein the detecting includes mass spectrometric detection of molecular oxygen cations concentration in the plasma.

3. The method according to claim 1 wherein the detecting includes optical emission spectrometric detection of atomic oxygen cations concentration in the plasma.

4. The method according to claim 1 wherein the selected parameter is pressure that is controlled to alter the ratio of molecular oxygen cations and atomic oxygen cations in the plasma toward substantially equal proportions.

5. The method according to claim 4 wherein the pressure is increased to increase the ratio of molecular oxygen cations to atomic oxygen cations.

6. The method according to claim 4 wherein the selected parameter is pressure that is altered to maximize the ratio of molecular oxygen cations to atomic oxygen cations.

\* \* \* \* \*